(12) United States Patent
Steinfeldt et al.

(10) Patent No.: US 8,399,059 B2
(45) Date of Patent: Mar. 19, 2013

(54) ENCAPSULATED CERAMIC ELEMENT AND METHOD OF MAKING THE SAME

(75) Inventors: Jeffrey A. Steinfeldt, Rio Rancho, NM (US); Carl Jojola, Albuquerque, NM (US); Bruce Johnson, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 268 days.

(21) Appl. No.: 12/840,464

(22) Filed: Jul. 21, 2010

(65) Prior Publication Data
US 2011/0020585 A1 Jan. 27, 2011

Related U.S. Application Data

(60) Provisional application No. 61/271,846, filed on Jul. 27, 2009.

(51) Int. Cl.
*B05D 3/12* (2006.01)

(52) U.S. Cl. ........................................... 427/289

(58) Field of Classification Search ............... 427/289
See application file for complete search history.

(56) References Cited

U.S. PATENT DOCUMENTS

| | | | |
|---|---|---|---|
| 4,514,247 A | 4/1985 | Zola | |
| 4,732,717 A | 3/1988 | Yanagida et al. | |
| 5,357,662 A | 10/1994 | Takagi et al. | |
| 5,504,980 A | 4/1996 | Yoshinaga et al. | |
| 5,623,236 A | 4/1997 | Yoshinaga et al. | |
| 5,729,239 A | 3/1998 | Rao | |
| 5,744,898 A * | 4/1998 | Smith et al. | 310/334 |
| 5,830,591 A | 11/1998 | Sengupta et al. | |
| 6,393,681 B1 | 5/2002 | Summers | |
| 6,620,287 B2 | 9/2003 | Cass | |
| 6,703,767 B1 * | 3/2004 | Summers | 310/340 |
| 6,844,861 B2 | 1/2005 | Peterson | |
| 6,925,693 B2 | 8/2005 | Takeuchi et al. | |
| 7,082,655 B2 | 8/2006 | Yetter et al. | |
| 7,096,547 B2 | 8/2006 | Yun et al. | |
| 7,109,642 B2 | 9/2006 | Scott | |
| 2001/0042291 A1 | 11/2001 | Esashi et al. | |
| 2003/0137223 A1 | 7/2003 | Kitajima et al. | |
| 2007/0228871 A1 | 10/2007 | Aoki et al. | |
| 2009/0021857 A1 | 1/2009 | Shelor | |
| 2009/0058230 A1 | 3/2009 | Kear et al. | |
| 2009/0207696 A1 * | 8/2009 | Goodemote | 367/158 |

* cited by examiner

FOREIGN PATENT DOCUMENTS

| | | |
|---|---|---|
| WO | WO0024080 | 4/2000 |
| WO | WO 2009/055767 | 4/2009 |

OTHER PUBLICATIONS

Zhen Yuhua et al: "Preparation and electrical properties of fine-scale 1-3 lead zirconic titanate/epoxy composite thick films for high-frequency ultrasonic transducers", Journal of Applied Physics, American Institute of Physics. New York, US LNKD-DOI:10.1063/1.2903456, vol. 103, No. 8, Apr. 25, 2008, pp. 84119(1)-84119(4), XP012110617 ISSN: 0021-8979 pp. 084119-1, col. 2, paragraph 3—pp. 084119-2, col. 1, paragraph 1 figure 1.

*Primary Examiner* — Kelly M Gambetta
(74) *Attorney, Agent, or Firm* — Daniel J. Deneufbourg

(57) ABSTRACT

A PZT (lead zirconate titanate) element including one or more outside surfaces including a layer of encapsulation and metallization material and the method of making the same including at least the steps of providing a wafer of ceramic material including a base and one or more walls defining one or more recesses in the wafer which are filled with an encapsulation material. The encapsulation material is then cured and a layer of metallization is applied to one or more of the outside surfaces of the wafer and encapsulation material. Cuts are then made through the layer of metallization and cured encapsulation material to divide the wafer into a plurality of individual and separate ceramic elements with one or more surfaces including a layer of metallization and encapsulation.

4 Claims, 4 Drawing Sheets

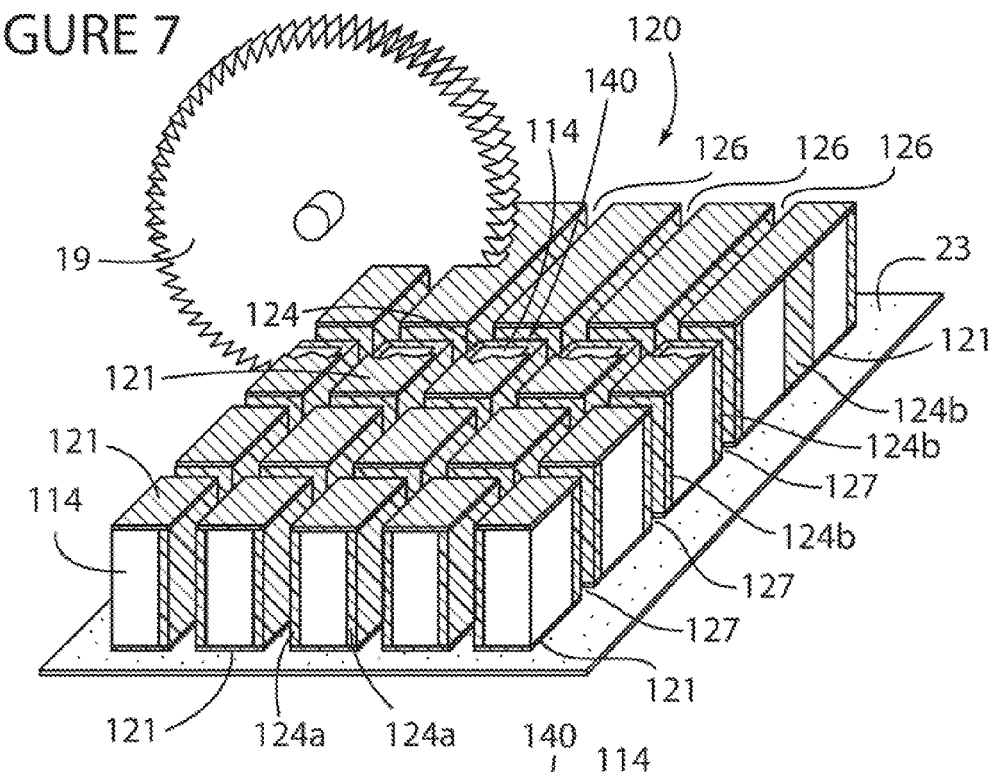
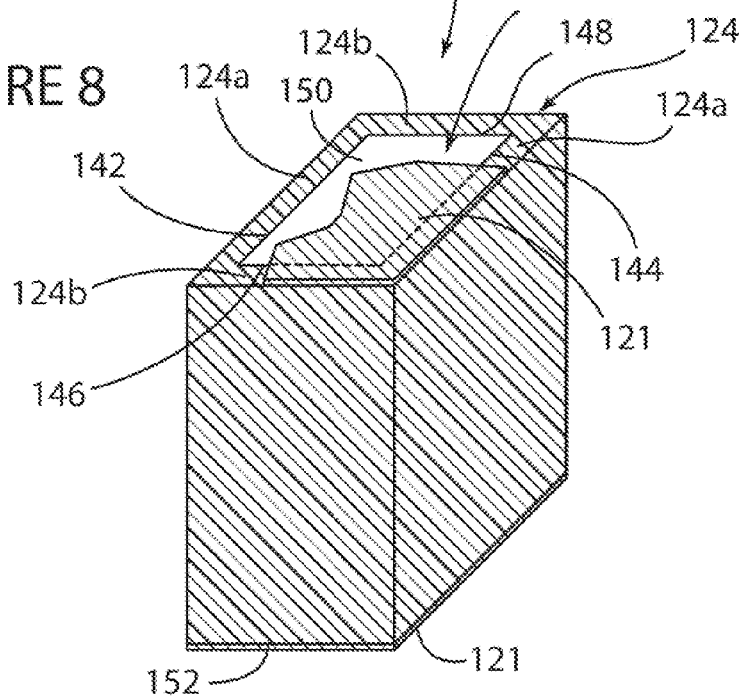

ENCAPSULATED CERAMIC ELEMENT AND METHOD OF MAKING THE SAME

CROSS-REFERENCE TO RELATED AND CO-PENDING APPLICATIONS

This application claims the benefit of the filing date of U.S. Provisional Patent Application Ser. No. 61/271,846 filed on Jul. 27, 2009 and entitled, "Encapsulated Ceramic Element and Method of Making the Same", the entire disclosure of which is explicitly incorporated herein by reference as are all references cited therein.

FIELD OF THE INVENTION

This invention relates to ceramic elements and, more specifically, to an encapsulated PZT (lead zirconate titanate) element and the method of making the same.

BACKGROUND OF THE INVENTION

PZT (lead zirconate titanate) ceramic elements are typically made through a process which includes cutting a wafer or block of PZT material into a plurality of smaller PZT elements. The cutting exposes the edges and surfaces of the PZT elements which, as a result of further processing or use, can cause one or more of the following: 1) the breakage of the PZT elements when the PZT elements are thin enough; 2) damage to the ceramic material on the edges and surfaces of the PZT elements; and 3) the release of particles of ceramic material from the edges and surfaces of the PZT elements and into the product(s) in which PZT elements are used such as, for example, disk drives.

SUMMARY OF THE INVENTION

The present invention is directed to an encapsulated ceramic element such as, for example, a PZT element, in which one or more of the outside surfaces thereof has been encapsulated with a layer of epoxy or the like protective encapsulation material and a layer of metallization. The invention is also directed to a method of making the same.

In one embodiment, the method of making the encapsulated ceramic element comprises at least the steps of providing a wafer of ceramic material; making a plurality of first spaced-apart cuts through the wafer to form a wafer including a base and a plurality of first spaced-apart walls extending away from the base and defining a plurality of first spaced-apart recesses between the plurality of spaced-apart walls; filling the plurality of recesses with an encapsulation material to define a wafer with a plurality of first spaced-apart layers of encapsulation material; grinding away at least the base of the wafer; and making a cut through selected ones of the plurality of layers of encapsulation material to divide the wafer into a plurality of separate and individual encapsulated ceramic elements, each including either one encapsulated outside surface or two opposed encapsulated outside surfaces.

According to the invention, a layer of metallization is applied over both the top and bottom outside surfaces of the wafer of ceramic material and opposed top and bottom edges of the layers of encapsulation material following the curing of the encapsulation material and grinding away of at least the base of the wafer.

In another embodiment, the method additionally comprises the steps of making a plurality of second spaced-apart cuts through the wafer in a relationship normal to the plurality of first spaced-apart cuts to define a wafer with a plurality of posts and second spaced-apart recesses oriented in a relationship normal to the first spaced-apart recesses; filling the first and second spaced-apart recesses with an encapsulated material to define first and second sets of intersecting layers of encapsulation material; applying a layer of metallization over the top and bottom outside surfaces of the wafer and the edges of the layers of encapsulation material following curing of the encapsulation material and grinding away of at least the base of the wafer; and making a cut through selected ones of the second spaced-apart layers of encapsulation material either prior to or following making the cut through selected ones of the first spaced-apart layers of encapsulation material to form a plurality of ceramic elements, each including at least two normal outside surfaces with a layer of encapsulation material thereon.

There are other advantages and features of this invention, which will be more readily apparent from the following detailed description of preferred embodiments of the invention, the drawings, and the appended claims.

BRIEF DESCRIPTION OF THE FIGURES

These and other features of the invention can best be understood by the following description of the accompanying drawings as follows:

FIG. 7 is an enlarged perspective view of the PZT wafer shown in FIG. 6 following dicing through the layers of metallization and encapsulation material to create a plurality of individual, separate encapsulated PZT elements; and FIG. 8 is an enlarged perspective view of one of the individual interior cut PZT elements shown in FIG. 7 which includes two sets of opposed encapsulated outer side surfaces and two opposed metallized outer top and bottom surfaces.

DETAILED DESCRIPTION OF THE EMBODIMENTS AND METHOD OF THE INVENTION

Figure 1:
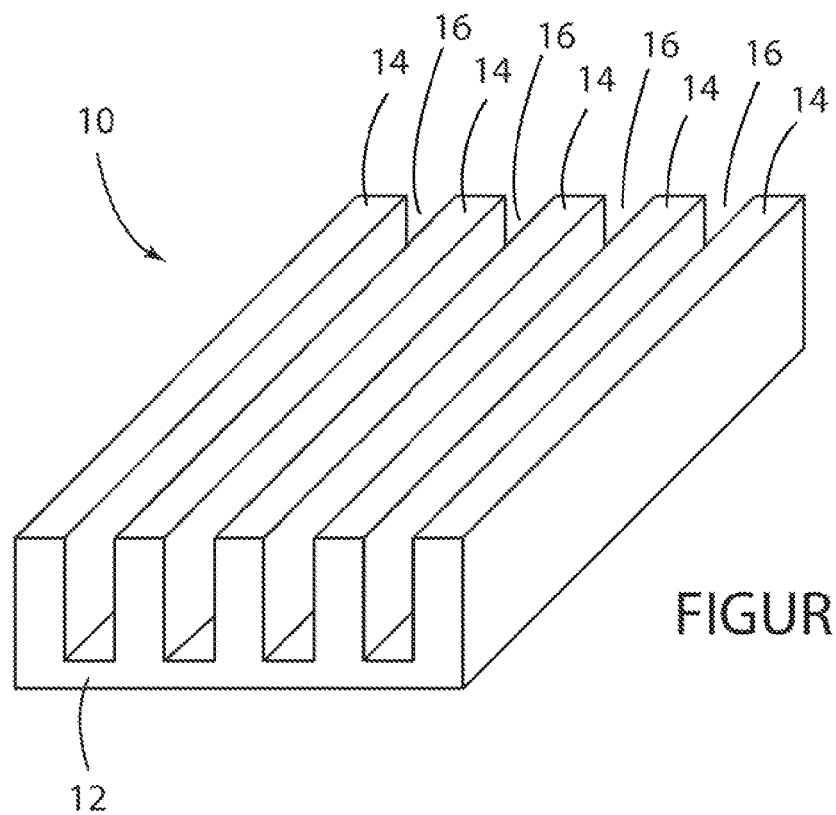
FIG. 1 is an enlarged perspective view of a diced starter wafer of PZT material which can be used as a starting material or block for making the encapsulated PZT element of the present invention.

FIG. 1 shows a base or starter wafer 10 of PZT (lead zirconate titanate) ceramic material which can be used as the starting material or block for making the encapsulated PZT elements of the present invention.

Although not shown or described herein in any detail, it is understood that the block or starter wafer 10 is made by providing a solid block of PZT ceramic material having a dimension (length, height, width) substantially larger than the dimension (length, height, width) of the final desired encapsulated individual PZT elements. The wafer 10 which is typically about 76 mm long, 1 mm high, and 76 mm wide is, in one embodiment, mounted on a dicing tape and diced (cut) to form a wafer 10 which includes a solid flat, generally rectangularly-shaped base 12 and a plurality of spaced-apart, parallel elongated walls 14 of PZT material extending generally unitarily normally outwardly and upwardly from the base 12 to define a plurality of spaced-apart, parallel, open channels or recesses or voids 16 therebetween also extending in an orientation generally normally upwardly from the base 12. Although FIG. 1 shows only a portion of a wafer 10 and only five walls 14 for illustration purposes, it is understood that the PZT wafer 10 includes more than one hundred fifty (150) such walls 14 and could include as many as one thousand (1,000) such walls depending upon the application.

Figure 4:
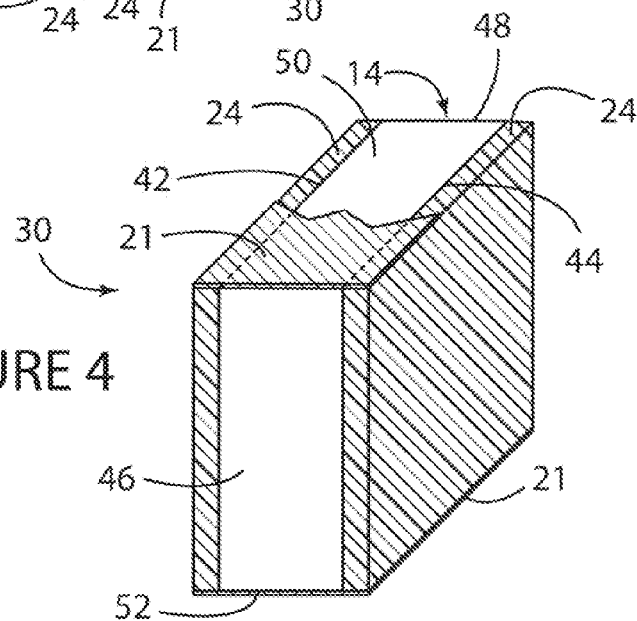
FIG. 4 is an enlarged perspective view of one of the individual interior cut PZT elements shown in FIG. 3 which includes two opposed encapsulated outer side surfaces and two opposed metallized outer top and bottom surfaces.

As described in more detail below, each of the walls 14 of PZT material will define the body or core 14 of each of the individual final PZT elements 30 of the present invention as shown in FIG. 4 and thus the wafer 10 is diced with a blade whose width and orientation during dicing will determine both the pitch of the walls 14 and thus the pitch of the body of the final PZT elements and also the thickness of the layers of encapsulation material on the final PZT elements.

For example, the use of a wide dicing blade during the initial dicing operation will result in a thicker layer of epoxy or the like encapsulation material on the final PZT elements, while the use of a thinner dicing blade during this initial dicing operation will result in final PZT elements with thin layers of epoxy or the like encapsulation material.

The pitch of each of the walls 14 in both the X and Y directions, and thus the final pitch of each of the final PZT elements, is determined by the following equation:

Pitch=poled shrinkage factor×(final dimension+final kerf)

The width of the dicing blade or cut for this initial processing operation is determined by the following equation:

First blade or cut width=Final blade or cut width+(2× remaining epoxy)

If PZT material is to be removed, then remaining epoxy=−(PZT to remove on the side).

Although not described herein in any detail, it is understood that the invention encompasses the use of any other suitable cutting apparatus to effect the initial cuts such as, for example, the use of a laser.

The second step (not shown) in the process of making encapsulated PZT elements in accordance with the present invention comprises filling all of the open channels 16 in the wafer 10 with a two-part epoxy resin or the like suitable encapsulation material.

After all the channels 16 have been appropriately filled, excess encapsulation material is removed or scraped (not shown) from the top and two exposed sides of the walls 14 of the wafer 10 and the encapsulation material is subsequently cured (not shown).

Figure 2:
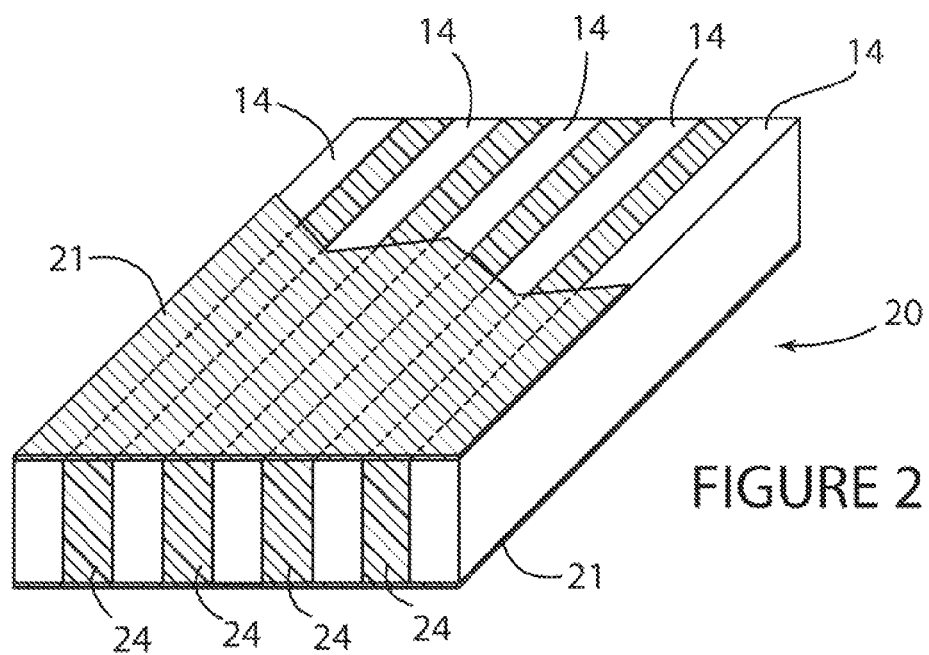
FIG. 2 is an enlarged perspective view of the PZT wafer of FIG. 1 after filling with encapsulation material, curing of the encapsulation material, grinding away of at least the base of the PZT wafer shown in FIG. 1, and the application of opposed layers of metallization thereto.

The top of the walls 14 of the wafer 10 and the base 12 of wafer 10 are then ground away using a suitable grinding apparatus to pre-poled thickness to create the ground PZT wafer 20 depicted in FIG. 2.

Ground PZT wafer 20 is comprised of a plurality of spaced-apart, parallel, elongate individual strips 14 of PZT material corresponding to and defined by the plurality of spaced-apart, parallel elongate walls 14 of the wafer 10 shown in FIG. 1. The strips 14 of PZT material are separated by, and are held together by, a plurality of spaced-apart, parallel layers of cured encapsulation material 24, i.e., a layer of encapsulation material 24 is located between each of the elongate strips 14 of PZT material in an alternating relationship with the strips 14.

The method of the present invention also includes the steps of metallizing the wafer 20, i.e., applying a layer 21 of conductive metal material to and over each of the outside top and bottom surfaces of the wafer 20 and the exposed top and bottom edges of each of the layers 24 of encapsulation material as also shown in FIG. 2; inserting electrodes in the wafer 20 (not shown); and poling the wafer 20 (not shown), i.e., photo-processing and etching the wafer 20 as desired.

Figure 3:
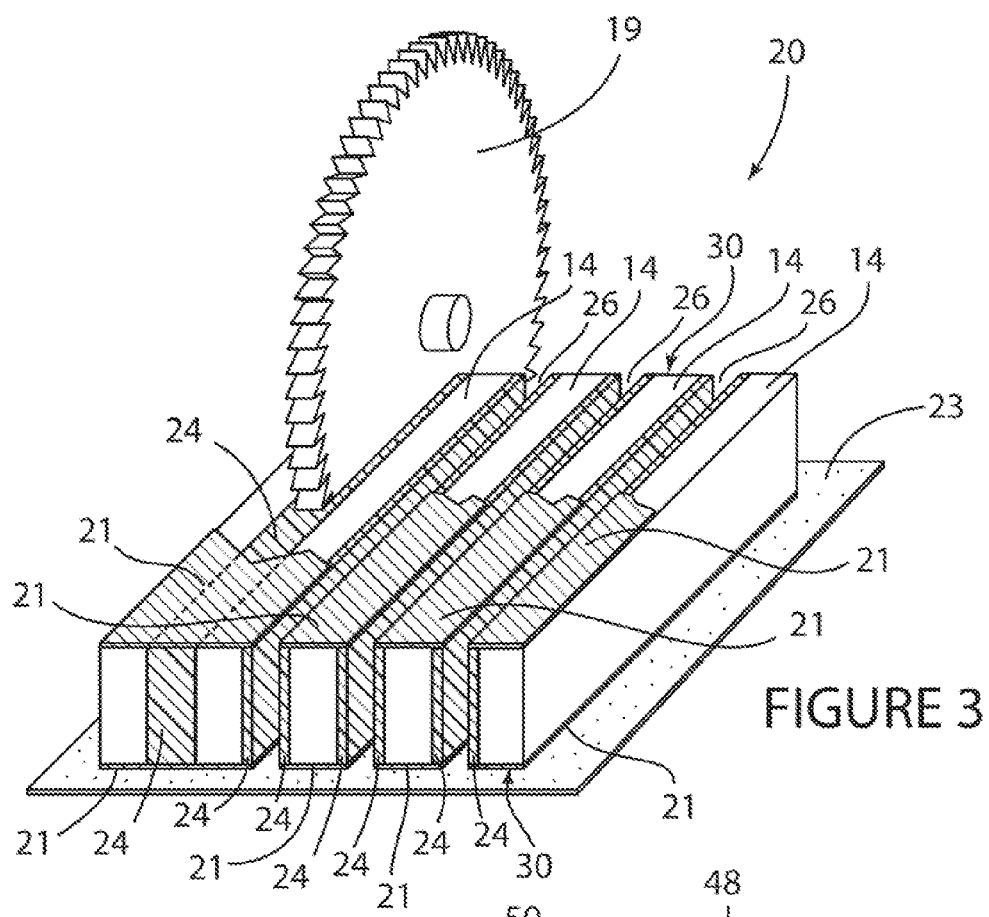
FIG. 3 is an enlarged perspective view of the PZT wafer shown in FIG. 2 following dicing through the layers of metallization and encapsulation material to create a plurality of individual, separate encapsulated PZT elements.

In accordance with the invention, the wafer 20 is then mounted onto a tape and frame apparatus (not shown) and, more specifically, is seated on a tape 23 as shown in FIG. 3, for the final cutting operation in which any suitable cutting apparatus such as, for example, a dicing blade 19, or other suitable cutting tool such as a laser, is used to form a longitudinal cut through each of the layers 21 of metallization and each of the layers 24 of encapsulation as shown in FIG. 3 which depicts the wafer 20 of FIG. 2 following the formation therein of a longitudinal cut 26 through the layers 21 of metallization and three of the four layers 24 of encapsulation material.

The width of the dicing blade 19 which, of course, is less than the width of the layer 24 of encapsulation material, determines the width or thickness of the layer 24 of encapsulation material which will remain on the two outside (exterior side) surfaces of the final encapsulated PZT elements.

The cuts 26 divide the PZT wafer 20 into a plurality of individual separate elongated encapsulated PZT elements 30, one of which is shown in FIG. 4, each defined by and including a center strip or body or core 14 of PZT material corresponding to and defined by the walls 14 shown in FIGS. 1-3, outside surfaces 42, 44, 46, 48, 50, and 52 on the body 14, a respective layer 24 of encapsulation material on and covering each of the opposed parallel outside (exterior/outer side) surfaces 42 and 44 of the body 14 of the PZT element 30, and a layer 21 of metallization on and covering each of the top and bottom outside/exterior/outer surfaces 50 and 52 and the top and bottom edges of each of the layers 24 of encapsulation material. The length and width of PZT element 30 can range from about 10 mils (0.01 inches) to about 1,000 mils (1 inch) but will typically be in the range of between about 40-60 mils (0.04-0.06 inches). The thickness of PZT element 30 can range from about 1 mil (0.001 inches) to about 100 mils (0.1 inches) but will typically be about 4 mils (0.004 inches).

In accordance with the present invention, the respective layers 24 of encapsulation material encapsulate and cover the respective outer side surfaces 42 and 44 of PZT element 30 to: protect the surfaces 42 and 44 from damage during further processing or use; strengthen the PZT element 30 during further processing or use; and prevent the release of particles of PZT material from the surfaces 42 and 44 during further processing and also prevent the release of particles of PZT material into the product(s) in which the PZT element 30 is used such as, for example, a disk drive.

Further, in accordance with the present invention, the metallization process which includes the placement of metallization over at least the top and bottom outer surfaces 50 and 52 and the top and bottom exposed edges of each of the layers 24 of encapsulation material reduces the risk of the layers 24 of encapsulation material separating from the body 14 and also creates a barrier preventing the entry of contaminants or the like between the edge of the layers 24 and the body 14.

Figure 5:
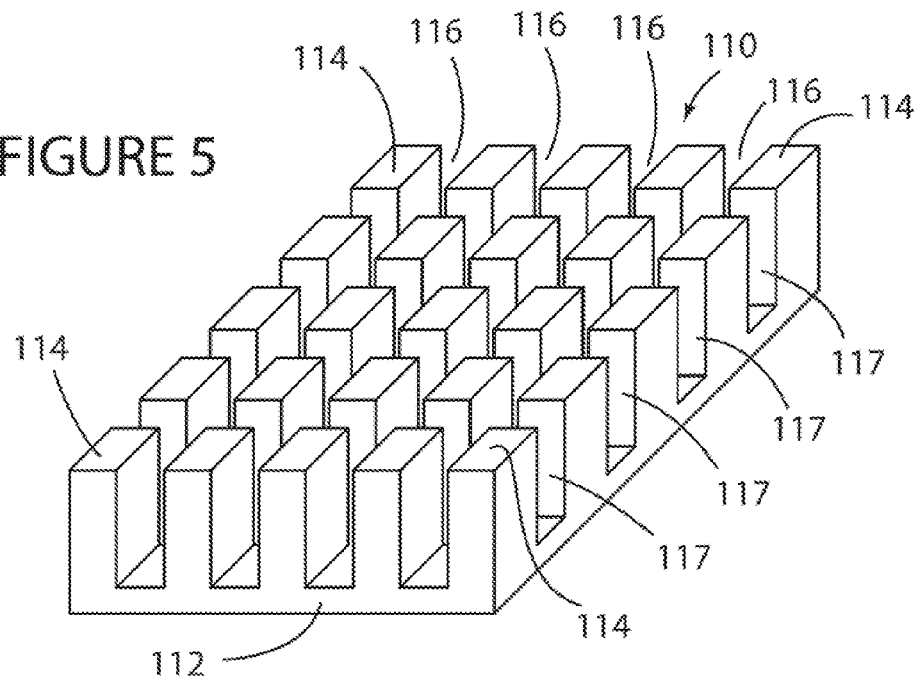
FIG. 5 is an enlarged perspective view of a diced grid patterned starter wafer of PZT material which can be used as a starting material or block for making another embodiment of an encapsulated PZT element of the present invention.

FIG. 5 shows a starter wafer 110 of PZT (lead zirconate titanate) ceramic material which can be used as the starting material or block for making another embodiment 140 of an encapsulated PZT element of the present invention as shown in FIG. 8.

The PZT element 140 shown in FIG. 8, which may be the same size as the PZT element 30, is made using the same elements, materials, and method as described above with respect to the PZT element 30 shown in FIG. 4 and thus the description above is incorporated herein by reference except as described below in more detail.

Initially, during the initial dicing of the starter PZT wafer block, additional parallel, spaced-apart cuts are made along the length of the starter PZT wafer 10 shown in FIG. 1 in a direction normal to the walls 14 and recesses 16 to create a starter PZT wafer 110 as shown in FIG. 5 which comprises a quadrant or checkerboard or grid pattern including a plurality of rows and columns of spaced-apart and parallel generally rectangularly-shaped posts or pillars 114 of PZT ceramic material extending and projecting unitarily generally normally outwardly from an interior surface of a solid lower generally rectangularly-shaped base 112 of the wafer 110 and defining a first set of spaced-apart and parallel recesses or voids 116 similar to the recesses 16 of the wafer 10 and, additionally, a second set of spaced-apart, parallel recesses or voids 117 extending along the length of the wafer 110 in an orientation normal to, and intersecting, the first set of recesses 116.

Figure 6:
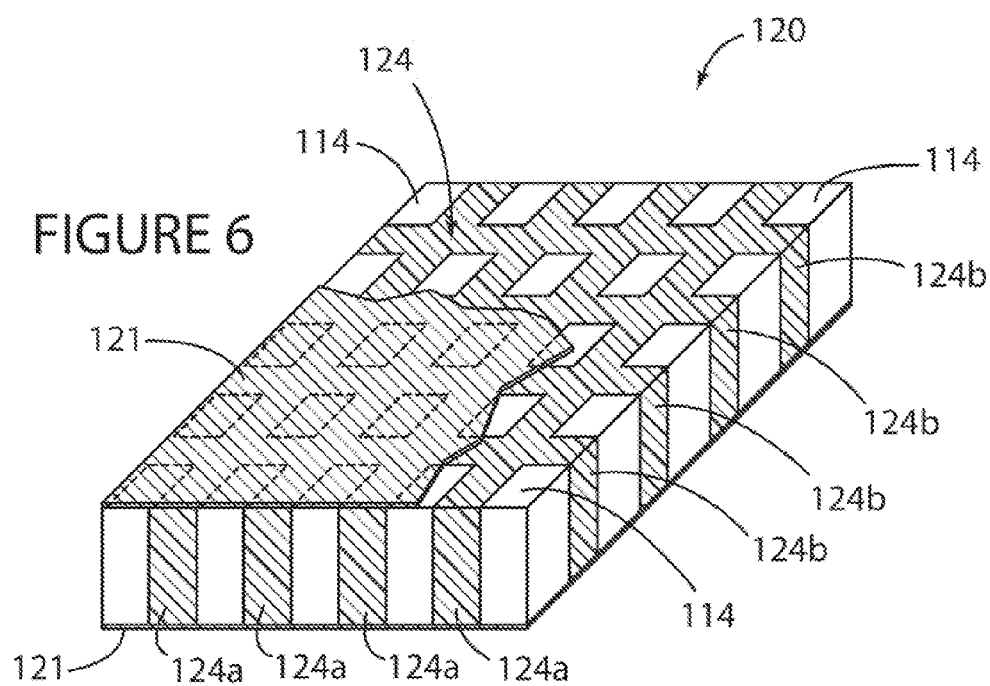
FIG. 6 is an enlarged perspective view of the PZT wafer of FIG. 5 after filling with encapsulation material, curing of the encapsulation material, grinding away of at least the base of the PZT wafer shown in FIG. 5, and the application of opposed layers of metallization thereto.

The first and second sets of recesses 116 and 117 are then filled with encapsulation material, the encapsulation material is cured, and the wafer 110 is then ground to form a ground wafer 120 as shown in FIG. 6 which includes a cured layer 124 of encapsulation material comprised of a first set of spaced-apart and parallel layers 124a of encapsulation material similar to the first set of layers 24 of encapsulation material of the ground PZT wafer 20 shown in FIG. 2 and additionally a second set of spaced-apart and parallel layers 124b of encapsulation material extending along the length of the ground wafer 120 in a direction normal to, and intersecting, the first layers 124a of encapsulation material shown therein.

The ground wafer 120 is also metallized as shown in FIG. 6, i.e., a layer 121 of metallization, i.e., conductive metal material, is applied to and over each of the top and bottom outside surfaces of the wafer 120 and the exposed outside top and bottom edges of each of the layers 124a and 124b of encapsulation material. As in the method relating to the PZT element 30, the layer 121 of metallization is applied following curing of the layers 124 of encapsulation material and grinding away of at least the base 112 of the starter PZT wafer 110.

The final cutting operation of FIG. 7 includes the steps of forming a first cut 126 through each of the first set of layers 124a of encapsulation material and layers 121 of metallization and an additional second cut 127 through each of the second set of layers 124b of encapsulation material and layers 121 of metallization to divide the wafer 20 into a plurality of individual PZT elements 140 as shown in FIG. 8, each including a central body or core 114 of PZT material corresponding to and defined by each of the posts 114 shown in FIGS. 5-7, outside surfaces 142, 144, 146, 148, and 150 on the body 114, a layer 124 of encapsulation material covering each of the outside (exterior/outer side) surfaces 142, 144, 146, and 148 of the body 114, and a layer 121 of metallization material covering each of the top and bottom outside/outer surfaces 150 and 152 of the body 114 and the top and bottom edges of the layer 124 of encapsulation material covering the surfaces 142, 144, 146, and 148.

Thus, in the embodiment of FIG. 8, the PZT element 140 includes a first set of opposed encapsulated outer side surfaces 142 and 144 with a layer 124a of encapsulation material thereon and a second set of opposed encapsulated outer side surfaces 146 and 148 with a layer 124b of encapsulation material thereon and orientated in a relationship generally normal to the surfaces 142 and 144 and the layer 124a of encapsulation material thereon.

While the invention has been taught with specific reference to the embodiments and methods described above, someone skilled in the art will recognize that changes can be made in form and detail to the embodiments and the methods without departing from the spirit and the scope of the invention. The described embodiments are thus to be considered in all respects only as illustrative and not restrictive.

For example, it is understood that, in the embodiment and method of FIGS. 1-4, the final cuts 26 may be made in selected ones of the layers 24 of encapsulation material of the wafer 20 shown in FIG. 2 so as to form an individual final PZT element 40 in which only one of the outer side surfaces 42 or 44 is encapsulated, i.e., by using a blade or laser beam in alternating ones of the layers 24 of encapsulation material wide enough to remove all of the encapsulation material.

It is also understood that, in the embodiment of FIGS. 5-8 where the wafer 120 also includes a layer 124 of encapsulation material comprising first and second intersecting layers 124a and 124b of epoxy material extending in a direction normal to and intersecting each other as shown in FIG. 6, the final cuts 126 may be made in selected ones of the layers 124a of the encapsulation material to form individual final PZT elements 140 including either only two normal encapsulated outside (exterior side) surfaces or three encapsulated outside (exterior side) surfaces again by using a blade or laser beam in selected ones of the plurality of layers 124a of encapsulation material wide enough to remove all of the encapsulation material.

Still further, it is understood that the present invention encompasses the encapsulated PZT elements, and the method of making encapsulated PZT elements, having shapes other than rectangular or square including, for example, curved and circular shapes.

The scope of the invention is, therefore, indicated by the appended claims rather than by the foregoing description. All changes that come within the meaning and range of equivalency of the claims are to be embraced within their scope.

We claim:

1. A method of making a plurality of separate PZT elements including one or more outer surfaces with a layer of metallization covering an edge of an encapsulation material comprising the steps of:
   a) providing a wafer of PZT ceramic material;
   b) making a plurality of first spaced-apart cuts through the wafer of PZT ceramic material to form a wafer of PZT ceramic material including a base and a plurality of first spaced-apart walls extending away from the base and defining a plurality of first spaced-apart recesses;
   c) filling the plurality of recesses with an encapsulation material to define a wafer of PZT ceramic material with a plurality of first spaced-apart layers of encapsulation material;
   d) curing the encapsulation material and grinding away at least the base of the wafer of PZT ceramic material following the step of filling the plurality of recesses with an encapsulation material;

e) of applying a layer of metallization to and over at least one of the surfaces of the wafer of PZT ceramic material and an edge of the layers of encapsulation material following the steps of curing the encapsulation material and grinding away at least the base of the wafer of PZT ceramic material; and f) making a cut in the wafer of PZT ceramic material through selected ones of the plurality of layers of encapsulation material to divide the wafer of PZT ceramic material into the plurality of separate PZT elements including the one or more outer surfaces with the layer of metallization covering the edge of the encapsulation material.

2. The method of claim 1, wherein the step of making a cut through selected ones of the plurality of layers of encapsulated material includes the step of making a cut having a width less than the width of the plurality of layers of encapsulation material.

3. The method of claim 1 further comprising the steps of:

a) making a plurality of second spaced-apart cuts through the wafer of PZT ceramic material in a relationship normal to the plurality of first spaced-apart cuts to define a wafer of PZT ceramic material with a plurality of posts and second spaced-apart recesses oriented in a relationship normal to the first spaced-apart recesses;

b) filling the first and second spaced-apart recesses with an encapsulation material to define a plurality of second spaced-apart layers of encapsulation material oriented in a relationship normal to the plurality of first spaced-apart layers of encapsulation material; and c) making a cut through selected ones of the second spaced-apart layers of encapsulation material either prior to or following making the cut through selected ones of the first spaced-apart layers of encapsulation material to form the plurality of separate PZT elements including at least two normal outer surfaces with encapsulation material thereon.

4. A method of making ceramic elements including one or more outer surfaces with a layer of metallization covering an encapsulation material comprising the steps of:

a) providing a wafer of ceramic material including a base and one or more walls defining one or more voids in the wafer;

b) filling the one or more voids in the wafer a ceramic material with an encapsulation material;

c) curing the encapsulation material;

d) grinding away at least the base of the wafer of ceramic material;

e) applying a layer of metallization to the wafer of ceramic material following the step of grinding away at least the base of the wafer of ceramic material;

f) making a cut in the wafer of ceramic material through the cured encapsulation material to divide the wafer of ceramic material into the ceramic elements including one or more surfaces with a layer of metallization covering an edge of the encapsulation material thereon.

\* \* \* \* \*